United States Patent [19]

Brickman et al.

[11] 3,721,838

[45] March 20, 1973

[54] REPAIRABLE SEMICONDUCTOR CIRCUIT ELEMENT AND METHOD OF MANUFACTURE

[75] Inventors: Norman F. Brickman; Leo B. Freeman, Jr., both of Poughkeepsie, N.Y.

[73] Assignee: International Business Machines Corporation, Armonk, N.Y.

[22] Filed: Dec. 21, 1970

[21] Appl. No.: 100,077

[52] U.S. Cl.............307/303, 317/234 S, 317/234 V, 317/235 D, 317/235 R

[51] Int. Cl...............................................H01l 19/00

[58] Field of Search...317/234, 235, 101 A; 307/204, 307/219, 303, 304; 340/173, 173 NR

[56] References Cited

UNITED STATES PATENTS

| | | | |
|---|---|---|---|
| 3,634,927 | 1/1972 | Neale et al. | 317/234 |
| 3,467,945 | 9/1969 | Myers | 340/173 NR |
| 3,500,148 | 3/1970 | Gunther et al. | 317/235 |
| 3,553,830 | 1/1971 | Jenny et al. | 317/235 |

OTHER PUBLICATIONS

Electronics, "Nonvolatile and Reprogramable, the Read–Mostly Memory is Here" by Neale et al. 9/28/70, pages 56–60

*Primary Examiner*—Jerry D. Craig
*Attorney*—Hanifin and Jancin and Joseph C. Redmond, Jr.

[57] ABSTRACT

A monolithic device is fabricated to permit electrical alteration thereof, whereby a circuit element or group of circuit elements therein may be substituted for other elements. An electrically alterable bistable element, typically an amorphous chalcogenide or amorphous metal-oxide, is suitably installed in the monolithic device by processes compatible with conventional semiconductor processes. The bistable element is connected in the circuit of the device and adapted to be electrically programmed for substitution of a circuit element or groups of circuit elements for other elements. The ability of a monolithic device to be repaired increases yields in manufacturing, lowers cost and extends the lifetime of such devices.

11 Claims, 8 Drawing Figures

INVENTORS
NORMAN F. BRICKMAN
LEO B. FREEMAN, Jr.
BY
ATTORNEY

REPAIRABLE SEMICONDUCTOR CIRCUIT ELEMENT AND METHOD OF MANUFACTURE

BACKGROUND OF THE INVENTION

1. Field of the Invention

This invention is directed to integrated semiconductor devices, circuits and processes of fabrication. More particularly, the invention is directed to semiconductor memory devices fabricated in unipolar or bipolar technology.

2. Description of the Prior Art

As the density of active/passive elements increases in monolithic devices, the probability of the failure of an element also increases. Failure of an element, obviously, terminates the operational effectiveness of the monolithic device since the element cannot be repaired. Monolithic devices having defective elements at the end of manufacturing cannot be accepted, which lowers yields and increases costs. Likewise, monolithic devices in service cannot be repaired and must be replaced, which decreases equipment reliability and serviceability.

The prior art, as evidenced by U.S. Pat. No. 3,170,071, has employed redundancy or spare substitution for damaged components. Also, alteration of a semiconductor component to add a circuit element to a device, as evidenced by U.S. Pat. No. 3,245,051, is practiced in personalizing a semiconductor member to perform a preselected function, e.g., read-only storage memory device. In an article appearing in the publication *Electronics*, issued Sept. 28, 1970, pages 56–60, a combined amorphous and crystalline semiconductor device is personalized to perform random-access-memory (RAM) function. However, the prior art does not describe a semiconductor device that is easily repaired by substituting one element for another, both elements being within the device. Stated another way, the prior art does not show a functional unit which includes spare elements that may be readily programmed to replace a defective element. Monolithic devices having such flexibility and repairability will increase manufacturing yields, lower costs and make such devices more generally available to the scientific, commercial and government communities.

Summary of the Invention

An object of the invention is a monolithic device that will increase manufacturing yields, lower costs and increase serviceability relative to comparable devices.

Another object is a repairable monolithic device and method of manufacture thereof.

Another object is a monolithic device adapted to permit a defective element to be replaced with a substitute element located within the device.

Still another object is a switching circuit embodied in a semiconductor element that is readily alterable by external means.

Still another object is a switching circuit embodied in a semiconductor element and adapted to be electrically programmed to substitute a circuit element for another element embodied in the circuit.

In accordance with one form of the present invention, a semiconductor member is processed using standard diffusion, photolithographic masking and metallizing processes to fabricate a monolithic memory device. Electrically alterable bistable elements of amorphous materials are incorporated into the member by processes compatible with the device fabrication. The monolithic device is adapted to have a storage array having word and bit entry, decoder circuits for selecting storage points, sense amplifiers, and other circuits necessary to perform functional memory operation for an information handling system. The storage array and decoder are arranged to have spare circuits incorporated in the member. The spare circuits are connected to but electrically isolated from the primary storage and decoder circuits by the electrically alterable bistable elements. During the manufacture of the device or while the device is in service, one or more circuits therein may test out to be defective. A spare circuit incorporated in the device may be substituted for the defective circuit by the application of suitable voltages to terminals of the device. The voltages, when appropriately chosen and applied to the terminals, actuate selected electrically alterable bistable elements to disconnect the defective cell from the device and connect the spare or substitute in place thereof. Once the electrical repair is complete, the device with the substituted circuits will function as the original device.

One feature is an alterable element, typically a chalcogenide glass device, that is compatible with silicon planar processing for incorporation into a monolithic device as a bistable element.

Another feature of the invention is a semiconductor circuit configuration that includes one or more alterable bistable elements which, when operated, function to disconnect portions of the circuit and/or connect other circuits together.

Another feature is a monolithic device and electrically alterable element arranged in a structure that is easy to manufacture, test, and operate with external signals to change the circuit configuration embodied in the device.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
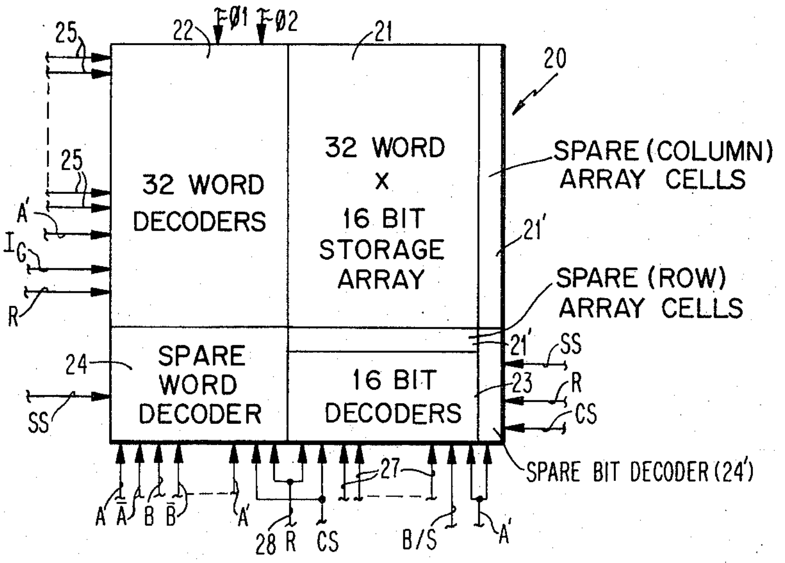
FIG. 1 is a planar view of a monolithic device employing the principles of the present invention.

Referring to FIG. 1, a semiconductor memory device 20 includes a storage array section 21, spare cells 21', word decoder and bit decode sections 22 and 23, respectively, and spare decoder sections 24, 24', all arranged within the confines of a semiconductor chip, typically of the order of 80 mils × 110 mils. In one form, the device is adapted for 512 bits of storage. Conveniently, the array is arranged for 32 words, each having 16 bits. Terminals (not shown) are disposed on the periphery of the device 20 to provide address inputs (SAR) 25 and 27 to the decoders 22 and 23, respectively. Additional terminals (not shown) are provided on the periphery of the device 20 for control purposes. The control signals supplied to the chip are Phase I ($\phi$1), Phase II ($\phi$2), Inverter gate ($I_G$), a restore signal (R), a select signal (SS), alteration (A') and a chip select CS. Output terminals (not shown) are also provided on the periphery to provide a bit sense (B/S) line.

The operation of the device, including the timing relation among the control pulses, will be described hereinafter.

Figure 2:
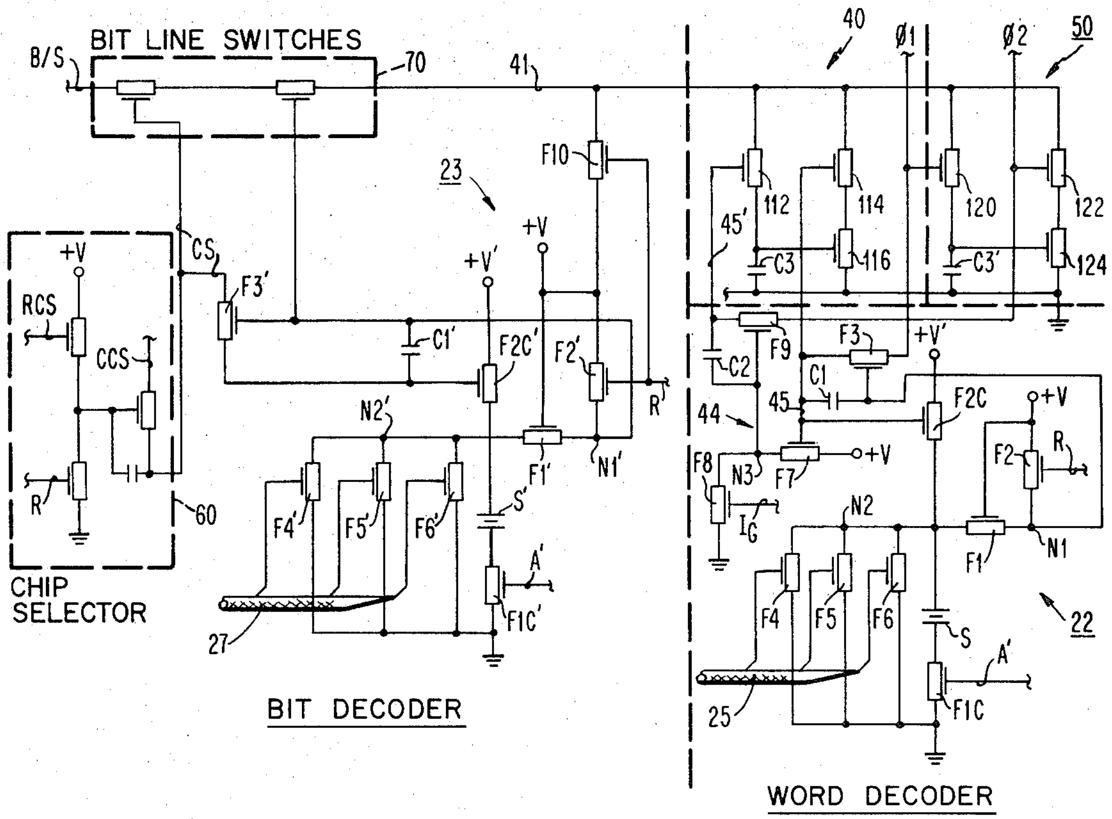
FIG. 2 is a partial electrical schematic of FIG. 1 showing a single storage array cell connected to a word and bit decoder.

Referring to FIG. 2, regular word decoder 22 and bit decoder 23 are shown, as typical examples of the decoders, connected to a storage cell 40 of the array shown in FIG. 1. A restore cell 50 is shown connected to the cell 40, for reasons described hereinafter. The word and bit decoders are electrically the same, except that a chip select (CS) signal is provided to the bit decoder only and an inverter gate ($I_G$) is provided to the word decoder only. A chip selector circuit 60, on another semiconductor device (not shown), provides the CS pulse for the bit decoders and a bit switch 70. (The storage chips 20 are arranged in an 8 × 16 matrix on a macromodule (not shown). Positive row chip select (RCS) and Column Chip Select (CCS) pulses will select a chip at the intersection of a given row and given column, respectively.)

The word decoder comprises address gates F4, F5, F6, each gate being a unipolar semiconductor device, typically a metal oxide semiconductor (MOS). Gate electrodes are connected to selected address lines. The source electrodes are multipled together and connected to a reference potential, typically ground. The drain electrodes of the devices are multipled together to form a node N2 and then connected as the source electrode of a device F1. The device F1 includes a gate electrode and drain electrode, the former being connected to a voltage supply (+V) and the latter being connected to a node N1. A device F2 has a drain electrode connected to the +V supply, a source electrode connected to the node N1 and a gate electrode connected to the restore signal (R). A device F3 has a drain electrode connected to the ($\phi$1) line, a gate electrode connected to the node N1, a source electrode connected as a word line input 45 to a row of *n* storage cells 40 where *n* is any number, and as a gating input to an inverter 44. A capacitor C1 is connected between the gate and source electrodes of the device F3. The inverter 44 comprises devices F7, F8 and F9 and controls the $\phi$2 line signal supply to each storage cell 40 in the column. The device F7 is gated by the output of the word decoder, as previously described. Drain and source electrodes of F7 are connected to the +V supply and node N3, respectively. The device F8 is gated by inverter gate pulse ($I_G$) when the address pulses are provided to the decoder 22. Source and drain electrodes of F8 are connected to a reference potential and node N3, respectively. A device F9 is gated by the node N3 with the output or source electrode being connected to the row of storage cells as word line 45' and the input or drain electrode being connected to the $\phi$2 line. A capacitor C2 is connected between the gate and source electrodes of the device F9.

To permit decoder 22 to be disabled, deactivating the word line 45, an electrically alterable element S, to be described hereinafter, has a terminal connected to node N2 and the other terminal connected to the drain of an MOS device F1C. The source electrode of F1C is connected to a reference potential, and a gate electrode is connected to the signal A'. Also, a device F2C has source and drain electrodes connected to the node N2 and a voltage supply +V', respectively, the gate electrode being connected to the line 45. The device F2C gates the burn out voltage +V' to the decoder selected to be removed.

The bit decoder 23 is identical to the word decoder 22. Accordingly, elements in the decoder 23 will have primed reference characters corresponding to those elements in the decoder 22. The restore signal provided for the decoder 22 is also provided as in input to an MOS device F10, the drain and source electrodes thereof being connected to the +V supply and a bit sense line 41 to a column of *n* storage cells 40. The chip select signal (CS) is provided to the device F3' and the bit switch 70 which controls the bit sense line 41.

Each storage cell 40 comprises three MOS devices 112, 114, 116 and capacitor C3. A restore cell 50 is associated with each row of storage cells. The cell 50 includes MOS devices 120, 122, 124 and capacitor C3'. The purpose of the restore cell is to regenerate a storage array cell on its respective bit sense line 41 after a read operation. The regeneration is accomplished by means of the application of Phase I, Phase II, restore pulses.

Figure 3:
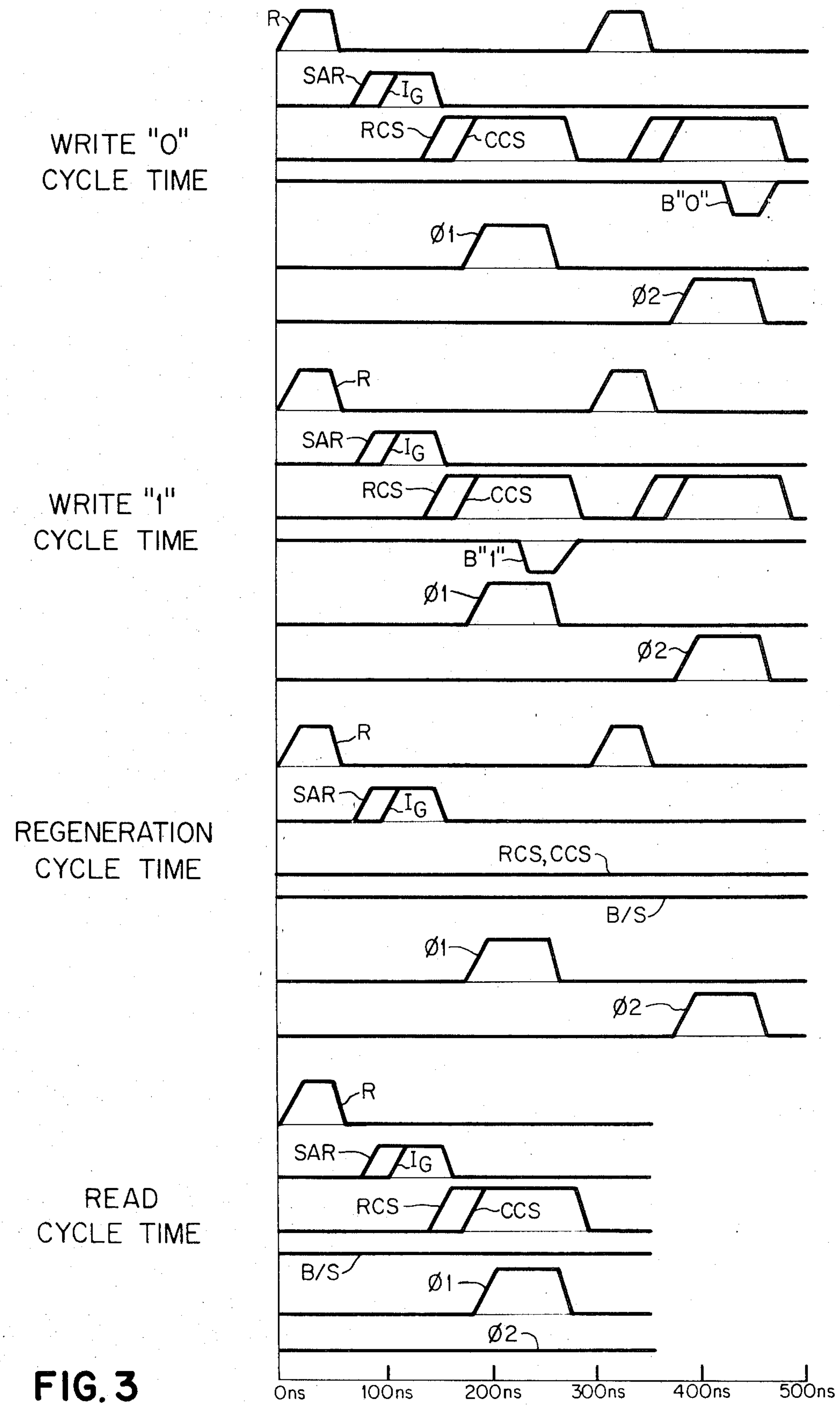
FIG. 3 is a timing diagram for the storage cell of FIG. 2.

Briefly, each cell has an address. When the address is provided to the decoders, particular word and bit decoders will operate to select the addressed cell. The Phase I and Phase II lines control the read and write cycle of each cell. A plurality of bit sense lines connect each of the cells to sense amplifiers (not shown). A bit sense line will either present a signal level on line 41 during a write cycle, or sense a drop in signal level on line 41 during a read cycle. Since the memory has a common bit sense line, it must be operated on a cyclical basis. That is, during a cycle, Phase II information is stored in the appropriate cell of the memory array, and during a Phase I cycle, information is detected from those cells having information stored therein. FIG. 3 shows four memory operations, each operation being distinct time wise from the other operations. The time scale only shows the period for an operation.

In the normal operation of the decoders shown in FIG. 2, address lines to devices F4, F5, F6 are initially down (i.e., at zero volts or ground) so F4, F5, F6 are turned off. Although only three address lines are shown, the number in an actual case can easily be more and would depend on the number of lines to be decoded; there will be one MOS device in the gate section of the decoder for each address line. A restore (R)

pulse is applied, causing nodes N1 and N2 to be charged to a positive voltage. Next, the regular or complementary address signals appear across the address lines. For instance, the first address line to F4 would be connected to A or $\bar{A}$, the second to F5 would be connected to B or $\bar{B}$, and the third to F6 would be connected to C or $\bar{C}$. Only one decoder out of eight, for example, of only three address lines, will not have at least one of F4, F5, F6, etc., turned on; hence, only one decoder will have nodes N1 and N2 remain at a positive voltage. In this condition, the decoder is designated as being "selected."

The CS and Phase I signals are now applied, only the decoder which has a positive voltage level on the gate of F3 will have F3 turned on and have a signal appear at the output terminal designated 45. Capacitor C1 provides positive feedback to the gate of F3 when Phase I is applied in order to strongly turn on F3. Then, node N1 rises in voltage due to the positive feedback from C1, F1 will turn off, preventing the additional charging of N2; this has the effect of reducing the required size of C1. The word and bit decoder output signals cooperate, to select a storage cell for read or write purposes. FIG. 3 shows the various signals to the word and bit decoders for the four operations. After reading, the restore or regeneration cycle shown in FIG. 3 is activated to restore a column of cells on a word line prior to the next read operation.

Particular details on the memory operation are available in Ser. No. 853,353, filed Aug. 27, 1969, and assigned to the same assignee as that of the present invention. Since the present invention is directed to an alterable decoder, further description of the memory operation is not believed necessary.

Figure 4:
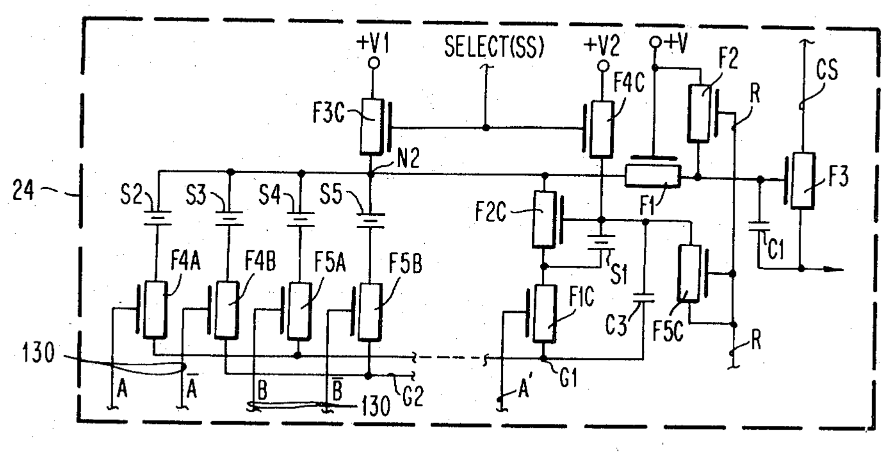
FIG. 4 is an electrical schematic of a spare decode circuit included in the device of FIG. 1.

Extra, or redundant, memory cells 21' are built into the array 21 of FIG. 1. Each of these rows and/or columns of spare cells is connected to a spare decoder located in the spare decoder sections 24 and 24' shown in FIG. 1. The connection between the rows of spare cells is identical to that for the regular decoder circuits and memory cells shown in FIG. 2. A spare bit or word decoder, shown in FIG. 4, is a modified regular decoder described in connection with FIG. 2. Address lines 130 are multipled to corresponding address lines 25 or 27 provided to the regular decoders described in FIGS. 1 and 2. Devices F4A, F5A, etc., have their source electrodes multipled together and connected to a first reference potential G1, typically ground. Devices F4B, F5B, etc., which receive complementary signals, have their source electrodes multipled together and connected to a second reference potential G2. The drain electrodes of all address devices are connected to node N2 through respective alterable elements S2, S3, S4, S5, etc. To activate a spare decoder, additional elements are required beyond the regular decoders shown in FIG. 2. A select signal (SS) and gate signal A' are provided, the former being provided to the gate electrode of MOS devices F3C and F4C, and the latter being provided to the gate electrode of the device F1C. Drain and source electrodes of F3C are connected to a supply +V1 and node N2, respectively. Drain and source electrodes of F4C are connected to a second supply +V2 and the drain electrode of F1C through alterable element S1. The source electrode of F1C is connected to the reference potential G1. MOS devices F2C and F5C cooperate with the device F1C to make sure that the spare decoder is not selected if it has not been programmed with an address. The remaining devices of the decoder F1, F2, F3 and C1, are identical to those described in FIG. 2.

When a memory circuit or decoder is defective, that portion of the device 20 may be removed from the circuit. The decoder that is chosen to be disabled is first selected and then disabled. To disable the regular decoder of FIG. 2, we first select it in the same manner as previously described so that node N1 is left at a positive voltage. The signal CS or Phase I is applied at a higher than usual voltage level, charging the gate of F2C. The voltage of +V' is now applied at roughly the same high voltage level, while the line A' is brought positive. The high voltage is now mainly across the switch S along with a reasonably low resistance load line, causing S to short out. During normal operation of the decoder, the signal A' always goes positive whenever the addresses and complementary addresses appear on the address lines. A decoder with S shorted will, therefore, never be selected.

To activate the spare decoder of FIG. 4 the SS line is brought to a high voltage by a direct connection to a voltage supply located outside the device. The voltage supply +V2 is applied simultaneously with the signal A' to burn out S1. This will cause F2C to remain off and will prevent the discharge of the decoded node when the signal A' appears during normal decoder operation. Then, S2 through S5, and any other devices in the address circuit section (two switches per bit), are shorted out one by one by applying +V1, successive addresses, and grounding either G1 or G2 (the other being brought positive). First, one of the two switches S2 and S3 is shorted with one address set and appropriate voltages for G1 and G2. Then, a new set of addresses and setting for G1 and G2 appears and one of S4 or S5 is shorted, and so on. For example, to short out S2, you would apply the address A = 1 ($\bar{A}$ = 0) and B = 0 ($\bar{B}$ = 1) (A "1 " level on an address line denotes a positive voltage), ground G1 and bring G2 to a positive voltage. The spare storage cells and spare decoder in sections 21' and 24 or 24' of FIG. 1 will now replace the defective decoder or storage cells in the device 20.

Figure 5:
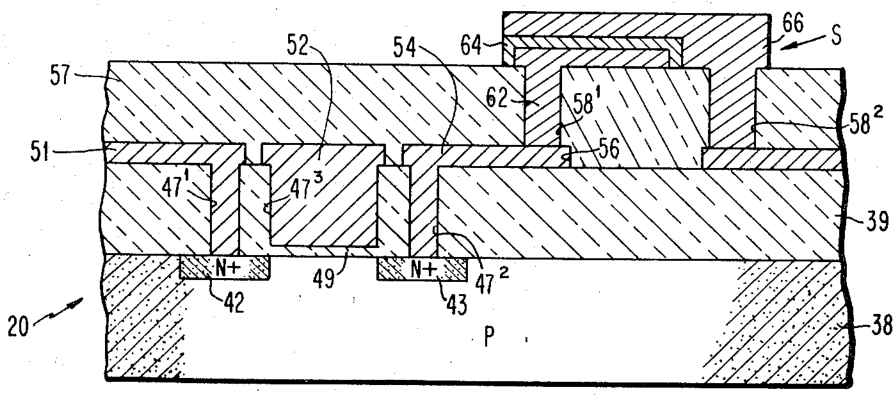
FIG. 5 is a cross-sectional view of metal-oxide semiconductor (MOS) and electrically alterable element included in the device of FIG. 1 and the circuits of FIGS. 2 and 4.

A description of the processes for fabricating the monolithic device of FIG. 1 is believed in order. Referring now to FIG. 5, a semiconductor substrate 38, typically P type, is selected for the device 20 of FIG. 1. The substrate 38 is doped with a P type impurity in a diffusion operation. Over the substrate an oxidation layer 39 is deposited by a thermal, reactive or anodizing process. The oxide is deposited to a thickness of about 5,000A. Conventional photolithographic masking and etching processes are employed to make openings in the oxide for formation of source, gate and drain electrodes. These electrodes are formed by two-step etching and diffusion operations. In the first step, openings $47^1$, $47^2$ are made in the oxide to expose the silicon surface. The next step in the electrode formation is an N+ diffusion through the openings $47^1$ and $47^2$ after the substrate surface 38 is exposed. The N+ diffusion establishes source 42 and drain electrodes 43. The PN junctions associated with these regions are caused to diffuse to a point where they approach the oxide layer between openings $47^1$ and $47^2$, the space between the source 42 and drain 43 being the gate region of the device. The oxide layer is reformed to a suitable thickness in the openings. An opening $47^3$ is made in the oxide by photolithographic masking and etching to expose the substrate 38. A 500A thickness of oxide is grown in the opening $47^3$ which is part of a gate electrode 49.

A metallization operation is conducted to fill the openings $47^1$, $47^2$, and $47^3$ with conductive material, typically aluminum, which connect the device to outside circuitry. The metallization is subjected to a conventional photolithographic masking and etching process to establish separate conductors 51, 52 and 54 for the source, gate and drain electrodes, respectively.

A further layer of silicon dioxide or glass 57 is deposited over the entire substrate surface by sputtering or sedimentation processes. Openings $58^1$ and $58^2$ are made in the layer 57 for the final formation of an electrically alterable element (S).

A niobium base electrode 62 is formed by depositing niobium over the substrate, masking and etching so that it overlies the sputtered silicon dioxide or quartz 57 in the opening $58^1$. The niobium is deposited by sputtering. Photoresist is used to protect the aluminum exposed in the opening $58^2$ during sputtering and the following oxidation. A niobium oxide layer 64 is formed by anodizing or chemically oxidizing the niobium film 62 to form a thickness of approximately 1,000A. The protective photoresist in the opening $58^2$ is removed and a bismuth counter-electrode 66 is vacuum deposited on the substrate, masked and etched, completing the formation of the element (S). A further passivation layer can be deposited on the substrate of the device to protect the surface from contamination.

The element S is a two-terminal device which, when initially built, has very high resistance. Under normal operating conditions, S's characteristics remain unchanged until appropriate currents are applied, as noted hereinafter. If a voltage threshold is exceeded, and adequate current provided, S can be broken down into a permanent, low resistance state. The elements can be designed to have their breakdown voltage lie inbetween the maximum operating voltages and the minimum breakdown voltages of the MOS devices. The initial resistance of a device with a 1 mil diameter exceeds $10^7$ ohms. An initial forming process (+30 volt, Bi positive) switches the device into a low resistance state resistance ($R \leq 5000$ ohms). The switching occurs in a diameter of less than 2 micron square. Additional details on the device are described by Hickmott et al in a publication entitled *Journal of Vacuum Science and Technology*, Volume 6, page 828 (1969).

A molybdenum-glass-molybdenum device may be formed in lieu of the niobium-niobium oxide-bismuth device of FIG. 5. The molybdenum is deposited by well-known evaporation or sputtering techniques or other techniques described, for example, in the *Physical Review Letters*, Volume 21, Number 20, p. 1450, "Reversible Electrical Switching Phenomena in Disordered Structures," S.R. Ovshinsky, and in the Energy Conversion Devices work in *Proceedings of the Symposium on Electrotechnical Glasses*, Imperial College, London, September 1970. A chalcogenide glass film is deposited by R.F. sputtering a powdered cathode. The operation of such devices as a bistable element is described in the foregoing publication as well as in *Applied Physics Letters*, Volume 15, Number 2, July 15, 1969, pp. 55–57, "Bulk and Thin Film Switching and Memory Effects in Semiconducting Chalcogenide Glasses," H.J. Stocker. While a molybdenum-glass-molybdenum device is preferred, it is also possible to form a similar device in aluminum-chalcogenide glass-aluminum elements. In such a case, in FIG. 5, elements 62 and 66 would be aluminum and element 64 would be an evaporated chalcogenide glass. While the materials of the present chalcogenide glass device are different from those in the Ovshinsky and Stocker publications, the operation of the present device is similar to those in the publications. To set a device ($R_H \rightarrow R_L$), (high to low resistance), a threshold (typically 8–25 volts) must be exceeded and then the voltage is retained on for an additional time to allow formation of the filament. A typical set time is 5–8 msec. Reset ($R_L \rightarrow R_H$) is produced by a current pulse. A typical reset current is 5–10 ma (1 mil device) and a typical pulse width is 10–100 $\mu$ sec.

A detailed description of the operation of another alterable element which function as bistable switching devices and may be substituted for the niobium device of FIG. 5 is described in a publication entitled "Bistable Switching in Zirconium Oxide-Gold Junctions" by K.C. Parks and S. Basavaiah, IBM Report RC 24.78, dated May 21, 1969.

While the preferred embodiment has been disclosed as being a MOS device formed with a P substrate and N+ diffusion region, the same functional objectives may be obtained by using an N substrate with a P+ diffusion region. Also, a decoder may be implemented in bipolar technology, as well as unipolar or MOS technology.

Figures 6, 7, 8:
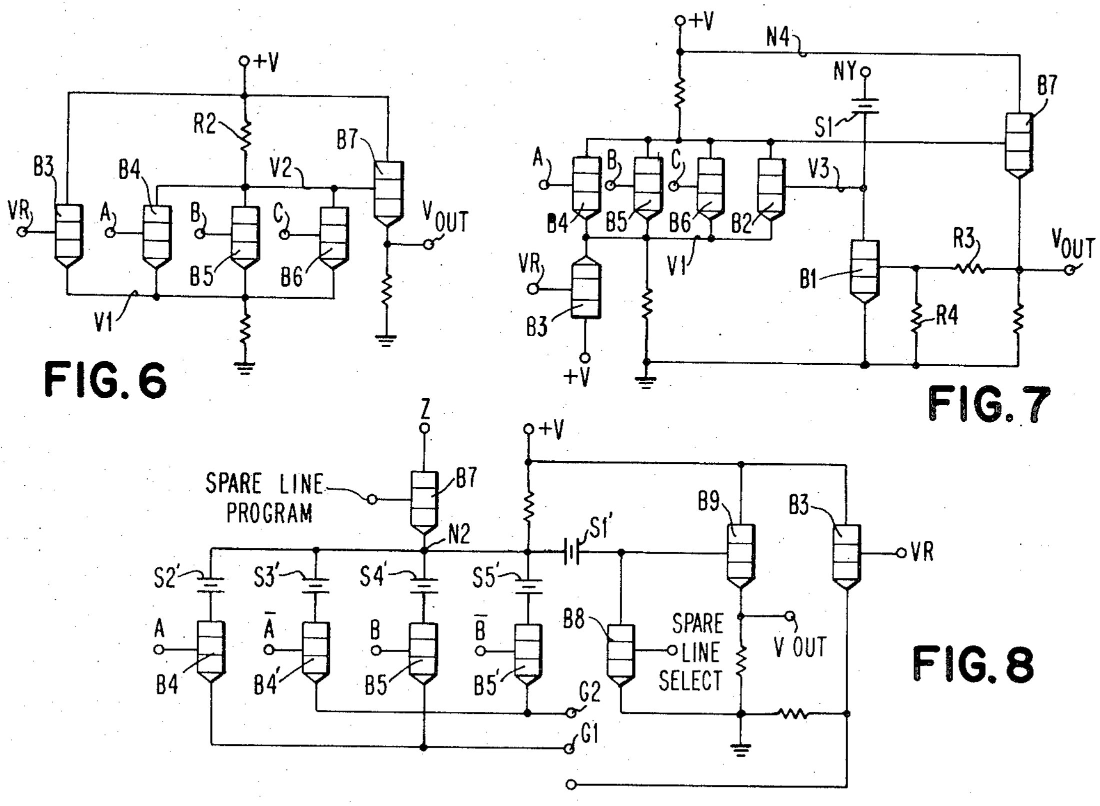
FIG. 6 is an electrical schematic of a bipolar circuit which functions as a decode circuit for a monolithic storage device array.
FIG. 7 is the circuit of FIG. 6 adapted to be electrically altered.
FIG. 8 is an electrical schematic of a spare bipolar circuit which may be substituted for the decode circuit of FIG. 7 in a monolithic storage device.

A regular decoder in bipolar technology is shown in FIG. 6. This decoder may be employed with memory arrays using bipolar devices as, for example, described in U.S. Pat. 3,508,209, issued Apr. 21, 1970, and assigned to the same assignee as that of the present invention. As shown in FIG. 6, transistor B3 and reference voltage VR determine the common emitter voltage V1. If all inputs, A, B, and C are low (below VR), transistors B4, B5 and B6 will be off and V2 will be equal to +V. The output emitter follower, B7, will be on and the output voltage, $V_{out}$, will be high (greater than VR). If any one or all inputs are high, the corresponding transistors will be on and current will flow through R2. Due to the voltage drop across R2, V2 will decrease and $V_{out}$ will be low (less than VR).

The logical operation of the circuit is thus seen to be $\text{OUTPUT} = \overline{A + B + C} = \bar{A}\bar{B}\bar{C}$. The output will be high if, and only if, all inputs are low. This circuit may thus be used as a decoder, activating an output line only when all address (input) lines are low.

FIG. 7 shows a circuit for a decoder that may be electrically disabled. That is, it normally works in the manner of the circuit of FIG. 6. However, by following a specific electrical procedure, the decoder can be disabled, resulting in a low output all the time, irrespective of the input addresses.

Under normal operation, common point NY is at +V but the electrically alterable element S1 is in a high resistance state. Thus, transistor B2 is off and has no effect on the operation of the circuit.

Resistors R3 and R4 are chosen so that transistor B1 is off when $V_{out}$ is low, and on when $V_{out}$ is high. Thus, V3 is at potential V1 when the decoder is not selected but drops to ground potential when the decoder is selected.

The decoder is disabled by addressing it and thus bringing V3 to ground. The voltage, VY, at common point NY, is then raised to a potential sufficient to break down S1 for the selected decoder but insufficient to break down the alterable elements in the unselected decoders (V threshold of alterable element) < (VY) < (V threshold of alterable element) + (V1). The voltage VY is now returned to +V. Transistor B2 is now always on, disabling the decoder. $V_{out}$ will always be low.

FIG. 8 illustrates a spare line decoder that can be electrically programmed to respond to any specified address.

Under normal operation, electrically alterable element S1' is in the high resistance state, disabling the decoder; that is, $V_{out}$ is always low.

To program the decoder, the SPARE LINE PROGRAM line is raised and point Z raised to a high voltage. By applying the appropriate addresses (A or $\bar{A}$, B or $\bar{B}$, etc.) and grounding or raising the common G1 and G2 lines, the desired alterable elements (S2' or S3', S4' or S5', etc.) can be shorted by means of current through B7. Raising both G1 and G2 and applying the SPARE LINE SELECT signal to B8 shorts S1', activating the programmed decoder.

Following the programming procedure, G1, G2, and the emitter of B3 (the two lines and the transistor are common to all the spare line decoders) are connected together and the decoder now operates in the manner of FIG. 6.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A switching device comprising a. A semiconductor substrate including a plurality of first and second switching circuits connected together and personalized in an active condition, b. at least one first bistable switching element united to the substrate and having a low impedance state and a high impedance state, c. gating means connecting said one first bistable switching element to at least one of said first circuits, d. redundant first and second switching circuits personalized in a passive switching condition, e. at least one second bistable switching element united to the substrate and having a low impedance state and a high impedance state, f. gating means connecting said second bistable switching element to at least one of said first redundant circuits, g. and means to selectively operate said gating means to cause said first and second bistable switching elements to change impedance states to disable a first and second active circuit and selectively activate a first and second redundant circuit, respectively, as a substitute for the latter.

2. The switching device of claim 1 wherein the first and second switching circuits comprise unipolar devices.

3. The switching device of claim 1 wherein the first and second switching circuits comprise bipolar devices.

4. The switching device of claim 1 wherein the bistable switching element is an amorphous switching element comprising a chalcogenide glass film disposed between molybdenum electrodes.

5. The switching device of claim 4 wherein the amorphous switching element comprises a chalcogenide glass film disposed between aluminum electrodes.

6. The switching device of claim 4 wherein the amorphous switching element comprises a niobium oxide film disposed between niobium and bismuth electrodes.

7. The switching device of claim 4 wherein the amorphous switching element comprises a zirconium oxide film disposed between zirconium and gold electrodes.

8. The switching device of claim 4 wherein the means to operate the amorphous switching elements comprises electrical signals for controlling the application of voltage to the amorphous switching elements to change the electrical states thereof.

9. The switching device of claim 4 wherein the switching devices are unipolar devices and the amorphous switching elements are chalcogenide glass films disposed between metal electrodes responsive to electrical signals that switch the amorphous switching elements from a first permanent state to a second permanent state to inactivate the selected first and second switching circuit and programmably activate the first and second redundant switching circuit as a substitute thereof.

10. A repairable monolithic memory device comprising a. a semiconductor substrate, b. a plurality of personalized storage circuits disposed within the substrate in an active state, c. a plurality of personalized decoder circuits disposed within the substrate in an active state and connected to said storage circuits, said decoder circuits being adapted to receive electrical input signals, d. at least one first bistable switching element united to the substrate and having a low impedance state and a high impedance state, e. gating means connecting said one first bistable switching element to at least one of said decoder circuits, f. at least one spare personalized storage circuit disposed within the substrate in a passive state, g. at least one spare personalized and programmable decoder circuits disposed within the substrate in a passive state and connected to said spare storage circuit, h. at least one second bistable switching element united to the substrate and having a low impedance state and a high impedance state, i. gating means connecting said one second bistable switching element to at least one of said spare decoder circuits, j. and means to selectively operate said gating means to cause said first and second bistable switching elements to change input state to disable a decoder circuit and storage circuit and selectively activate a spare decoder and storage circuit as a substitute for the disabled circuits, respectively without alteration of the input signals.

11. The repairable monolithic memory device of claim 10 wherein the personalized decoder and storage circuits are greater in number than the number of personalized spare decoder and storage circuits.

* * * * *